United States Patent [19]
Burkhard et al.
[11] 3,855,555
[45] Dec. 17, 1974

[54] DELTA MODULATOR HAVING LOW-LEVEL RANDOM NOISE CHARACTERISTIC

[75] Inventors: Mahlon D. Burkhard, Hinsdale; Richard W. Peters, Algonquin, both of Ill.

[73] Assignee: Industrial Research Products, Inc., Elk Grove Village, Ill.

[22] Filed: Aug. 25, 1972

[21] Appl. No.: 283,925

Related U.S. Application Data

[63] Continuation-in-part of Ser. No. 69,524, Sept. 4, 1970, Pat. No. 3,681,531.

[52] U.S. Cl. ................ 332/11 D, 325/38 B, 325/42
[51] Int. Cl. ........................ H03k 13/22, H03k 7/00
[58] Field of Search ....... 332/11 R, 11 D; 325/38 B, 325/38 R, 42

[56] References Cited

UNITED STATES PATENTS

| | | | |
|---|---|---|---|
| 3,453,562 | 7/1969 | Magnuski | 332/11 D |
| 3,643,180 | 2/1972 | Shimamura et al. | 325/38 B |
| 3,646,442 | 2/1972 | Kotch | 325/38 B |
| 3,703,688 | 11/1972 | Flanagan | 332/11 D X |

OTHER PUBLICATIONS

Hellwarth et al., "Push–Pull Feedback Delta Modulator" – Dec. 1968, pp. 877–878, Vol. 11, No. 7, IBM Technical Bulletin.

*Primary Examiner*—Alfred L. Brody
*Attorney, Agent, or Firm*—Kinzer, Plyer, Dorn & McEachran

[57] ABSTRACT

A delta modulator for analog-digital conversion, comprising a high gain comparator amplifier connected to the input of a clock-controlled sampling flip-flop circuit; an audio signal is applied to the input of the comparator and a principal integrating circuit of short time constant develops a replica of the audio signal from the output of the flip-flop, and applies the replica to the comparator in bucking relation to the original audio signal. A self-bias variable D.C. reference signal is derived from the flip-flop output and is applied to the other comparator input; the bias circuit also transmits a negative feedback A.C. signal of limited amplitude, asymmetrical with respect to polarity, introducing a limited amplitude broad-band random noise into the demodulated output signal for idling (zero or very small input) conditions.

6 Claims, 3 Drawing Figures

DELTA MODULATOR HAVING LOW-LEVEL RANDOM NOISE CHARACTERISTIC

CROSS REFERENCE TO RELATED APPLICATION

This application is a continuation-in-part of application Ser. No. 69,524, filed Sept. 4, 1970, now U.S. Pat. No. 3,681,531 on behalf of the same inventors.

BACKGROUND OF THE INVENTION

Delta modulation, in its simplest form, is a method of converting an analog signal to a digital signal which can be demodulated to a staircase approximation or replica of the original analog signal. Departure from true reproduction of the original signal is expressed in terms of an effectively added noise. Normally, this noise is sufficiently random in nature and is adequately masked by the analog signal to allow utilization of delta modulation in audio equipment. However, a particularly subjectively annoying noise is present in the demodulated signal output under idling conditions, with no signal or only a very low-level signal input to the delta modulator. This noise is known as idling noise or threshold noise.

In a delta modulator, the digital signal is formed by sampling the polarity of the difference between the analog input signal and a demodulated signal derived from weighting of the digital signal in an integrator. The basic circuit for analog to digital conversion consists of a comparator, a clock-actuated gate for sampling the output of the comparator, and an integrating network for decoding or demodulating the digital signal output of the gate. The comparator compares the original analog signal and the demodulated signal derived from the digital output and the integrator circuit. The comparator output polarity is sampled by the gate at fixed clock intervals and digits of proper polarity to reduce the difference between the analog signal and the decoded signal are generated. An exact duplicate of the integration network used in the delta modulator can be used, after the digital signal has been processed or transmitted, to demodulate the digital signal and thus recover a replica of the original signal.

Unless a delta modulator is perfectly balanced, with the feedback signal exactly matched to the mid-point of the reference voltage, appreciable idling noise, as described above, may be reproduced in the demodulated signal. This idling noise is particularly apparent at times when the input signal is zero. The magnitude of the idling noise and the frequency content vary, with minimum and maximum levels in the noise occurring with variations in the degree of unbalance in the circuit.

A precisely balanced delta modulator does eliminate idling noise. However, accurate and precise balancing is difficult to achieve. Moreover, after a period of time, the aging of circuit components almost inevitably introduces an appreciable degree of imbalance and hence some noise. The same effect frequently results from departures from the balanced condition due to temperature changes and other environmental changes.

Furthermore, the response of a perfectly balanced delta modulator to small input signals is still unsatisfactory, as applied to many audio systems. An input signal having an amplitude just sufficient to break the perfect idling pattern of the precision balanced modulator causes bursts of noise in the output which are strongly correlated with the input signal. The subjective result is an undesirable harsh noise occurring "behind the signal." In contrast, a delta modulator that is just slightly unbalanced can be made to operate with a low noise level, a noise level that does not rise appreciably or change in tonal character as the input signal amplitude is increased or decreased near the zero level. Thus, particularly for audio system work, it is desirable to have the delta modulator operate at a noise level that is quite small and that is relatively uniform over a broad band of frequencies rather than introducing isolated tones or twitters which are subjectively annoying.

One previously proposed method for maintaining a low-level wide-band noise characteristic, in the operation of a delta modulator, is to deliberately add a small "white noise" component to the modulator input. This affords a constant stimulation of the modulator and prevents establishment of a fixed idling pattern, and may also provide a smooth low-level signal transition from the zero input state. However, the overall noise of the system is often raised above desirable limits. A similar approach to the problem comprises the addition of a single-frequency "tickler" signal to the modulator input, which can be filtered out at the final output if desired. This technique, as well as that involving an added noise component, adds to the cost and complexity of the modulator and also may increase noise above desired levels.

A third approach to the idling and transition problems of delta modulators is to deliberately unbalance the modulator by an amount which affords an idling pattern of relatively low noise amplitude in the audio frequency range. This method can be employed effectively, but requires careful setting of the feedback circuit to achieve the necessary slight imbalance and is subject to the same difficulties with respect to drift due to aging of components or temperature variations as discussed above for a precisely balanced modulator. A similar technique is described in Bowers U.S. Pat. No. 2,817,061, in which the integrator feedback loop is constructed to provide a response for negative-going pulses that is different from the response to positive-going pulses. This asymmetrical arrangement, however, tends toward an asymmetrical overload characteristic that restricts the dynamic range of the delta modulator.

SUMMARY OF INVENTION

It is a principal object of the invention, therefore, to provide a new and improved delta modulator, suitable for audio signal processing, that effectively and inherently minimizes or eliminates the problems and difficulties discussed above.

A further object of the invention is to provide a new and improved delta modulator that provides a low idling noise which is random in nature and subjectively more acceptable than in previously known devices. Smooth noise performance is provided during transition between no-signal and signal input conditions.

A particular object of the invention is to provide a new and improved delta modulator, capable of effective processing of audio signals occurring over a wide dynamic range, which introduces no more than a minimal noise content into the audio signal; the noise level is not raised in the process of providing smooth operation at low input signal levels, nor is there an increased tendency toward overload.

Another object of the invention is to provide a new and improved delta mod lator, modulator, audio signal processing, that maintains a relatively constant low level of noise over a substantial frequency range and that affords substantially uniform and stable operation over long periods of time, with little or no change resulting from substantial variations in temperature and other environmental conditions.

A specific object of the invention is to provide a new and improved low-noise delta modulator, suitable for audio signal processing, that is simple and inexpensive in construction, yet affords improved performance in comparison with previously known circuits.

Accordingly, the invention relates to a delta modulator, suitable for audio signal processing, which provides a subjectively tolerable low-level random idling noise in the demodulated output of the modulator. The delta modulator comprises high-gain comparator amplifier means having two inputs and an output, input means for applying an initial analog signal to one input of the comparator amplifier means, and a sampling gate comprising a flip-flop circuit having a main input, a sampling input, and first and second outputs, one of the gate outputs comprising the modulator output, with the main input of the sampling gate being connected to the output of the comparator amplifier means. Clock means are provided for applying a high-frequency clock signal to the sampling input of the gate to control actuation of the gate between two alternate operating conditions and generate two pulse signals of inverse polarity at the gate outputs. A principal integrating negative feedback circuit, having a short time constant, is connected from one output of the sampling gate to one input of the comparator amplifier means, for integrating one pulse signal from the gate to develop a replica analog signal and for applying that replica signal to the comparator amplifier means, in bucking relation to the initial analog signal. A self-bias feedback circuit, comprising an integrating circuit having a long time constant, is connected from one output of the sampling gate to one input of the comparator amplifier means, for applying a self-bias reference to the comparator amplifier means; the self-bias feedback circuit also transmits a negative feedback A.C. signal of limited amplitude to introduce a limited broad-band noise content into the output signal of the modulator. One of the feedback circuits is connected to the input of the comparator amplifier means that is not used for the initial analog signal.

DESCRIPTION OF THE PREFERRED EMBODIMENTS

Figure 1:
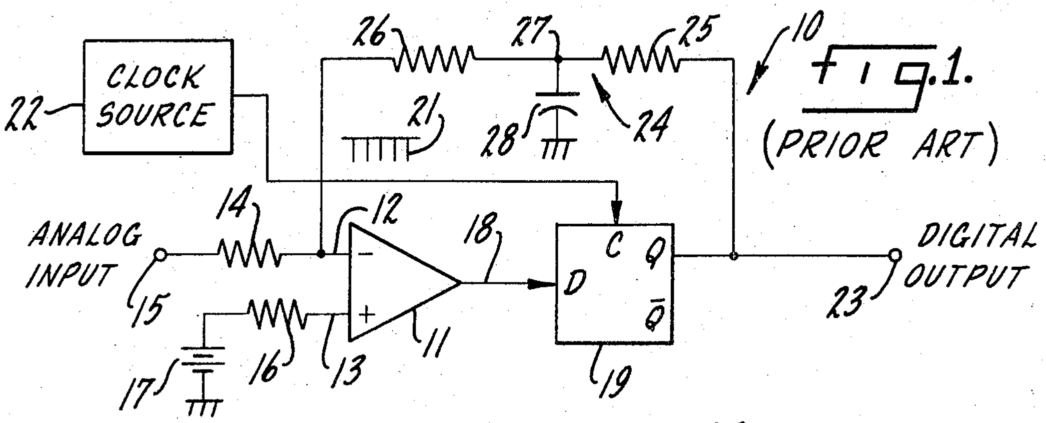
FIG. 1 is a circuit diagram of a conventional delta modulator circuit.

FIG. 1 illustrates a conventional delta modulator circuit 10 comprising a high gain comparator amplifier 11 having an inverting input 12 and a non-inverting input 13. Modulator 10 includes input means for applying an initial analog signal to one input of the comparator amplifier 11. In the illustrated circuit the input means comprises a series resistor 14 connecting an input terminal 15 to the inverting input 12 of device 11. A reference circuit is connected to the other input 13 of comparator amplifier 11. In the simple form illustrated in FIG. 1, the reference circuit comprises a resistor 16 connected in series with a battery 17 from the input terminal 13 to a plane of reference potential, shown as system ground.

The comparator amplifier 11 has an output 18 that is connected to the main input D of a flip-flop circuit 19. The flip-flop 19 functions as a sampling gate, the sampling rate being determined by a clock signal 21 applied to the sampling input C of circuit 19 from a clock source 22. Clock source 22 may comprise any conventional oscillator circuit affording sharply defined clock pulses for the clock signal 21.

The Q output of flip-flop circuit 19 is connected to an output terminal 23 that constitutes the output terminal for delta modulator 10. The Q output of the flip-flop circuit is also connected to an integrating negative feedback circuit 24 comprising two series-connected resistor 25 and 26, resistor 26 being connected back to the inverting input 12 of comparator amplifier 11. Feedback circuit 24 has a short time constant. The common terminal 27 of resistors 25 and 26 is connected to a capacitor 28 which is returned to system ground.

When no input signal is supplied to terminal 15, comparator 11 compares the reference voltage from circuit 16, 17 with the charge on capacitor 28 in the integrating feedback circuit 24. If the reference voltage is larger than the charge on capacitor 28, the comparator goes to its high amplitude operating condition. Flip-flop circuit 19 samples the output of comparator 11 at each pulse of clock signal 21 by transferring the input at terminal D, at the instant of the clock pulse, to the Q ouptut of the flip-flop. Thus, the output signal at terminal Q goes high, adding to the charge on capacitor 28.

When the next clock pulse occurs, the voltage on capacitor 28 may still be below the voltage supplied to comparator 11 through the reference circuit 16, 17. Under these circumstances, the comparator output remains high. Accordingly, the Q output of flip-flop 19 remains high for another clock period and the charge on capacitor 28 is further increased. This process is continued until the voltage on capacitor 28 exceeds the reference voltage. When this occurs, comparator 11 reverts to its low state and the next sampling action in flip-flop 19, occurring in coincidence with the next pulse of clock signal 21, causes the Q output of gate 19 to go low, allowing some discharge from capacitor 28 and tending to reduce the charge on the capacitor.

In this manner, an equilibrium idling state is achieved when the average voltage on capacitor 28 equals the reference voltage applied to comparator 13 through the reference circuit 16, 17. In equilibrium, the output signal appearing at flip-flop terminal Q reverses its state at each pulse of clock signal 21, producing an output signal at terminal 23 that constitutes a square wave having a frequency of one-half the frequency of clock signal 21. For this idling mode of operation, a small charge is added on capacitor 28 at every other pulse of the clock signal 21 and a corresponding small charge is dissipated from the capacitor on each alternate pulse.

If an analog signal is now applied to input terminal 15, comparator 11 drives flip-flop circuit 19 so that pulses are produced to charge capacitor 28 in a manner that follows the input voltage. This results in a modulation of the digital output signal appearing at terminal 23, incorporating in the digital signal the information conveyed by the analog input supplied to terminal 15. The integrating feedback circuit 24 develops a replica analog signal that is continuously supplied to comparator terminal 12, in bucking relation to the input signal, so that the feedback signal is a negative feedback.

To consider the equilibrium or idling condition in greater detail, it may again be assumed that no analog input signal is supplied to terminal 15. For this condition, it is apparent that unless the reference voltage supplied to terminal 13 is exactly equal to the average D.C. value of the digital square wave produced at terminal 23, occasional departures from perfect idling must occur. For example, if the peak-to-peak variation for the digital output signal is from zero to +1 volt, so that the average for perfect idling is 0.5 volt, and if the reference voltage is 0.6 volt, then occasional +1 volt pulses must replace zero volt pulses in the output signal to provide the additional 0.1 volt charge on capacitor 28. That is, the pulse pattern for the digital output signal must deviate from perfect alternation in order to have an average charge on capacitor 28 of 0.6 instead of 0.5 volt.

As a consequence of this deviation, frequencies lower than the perfect idling frequency of one-half the clock frequency 21 occur in the digital pattern for the output signal appearing at terminal 23. In general, some frequency variations are always present in the audio range. This is the idling noise of the conventional delta modulator. The amplitude of the audio noise and the frequency content of the audio noise vary in a manner such that maximum and minimum levels in the audio noise occur as the degree of unbalance for the delta modulator is varied. The difficulties and problems presented in minimizing the idling noise and the related transition noise produced by variations from no-signal to signal conditions at terminal 15 are discussed in detail above.

Figures 2, 3:
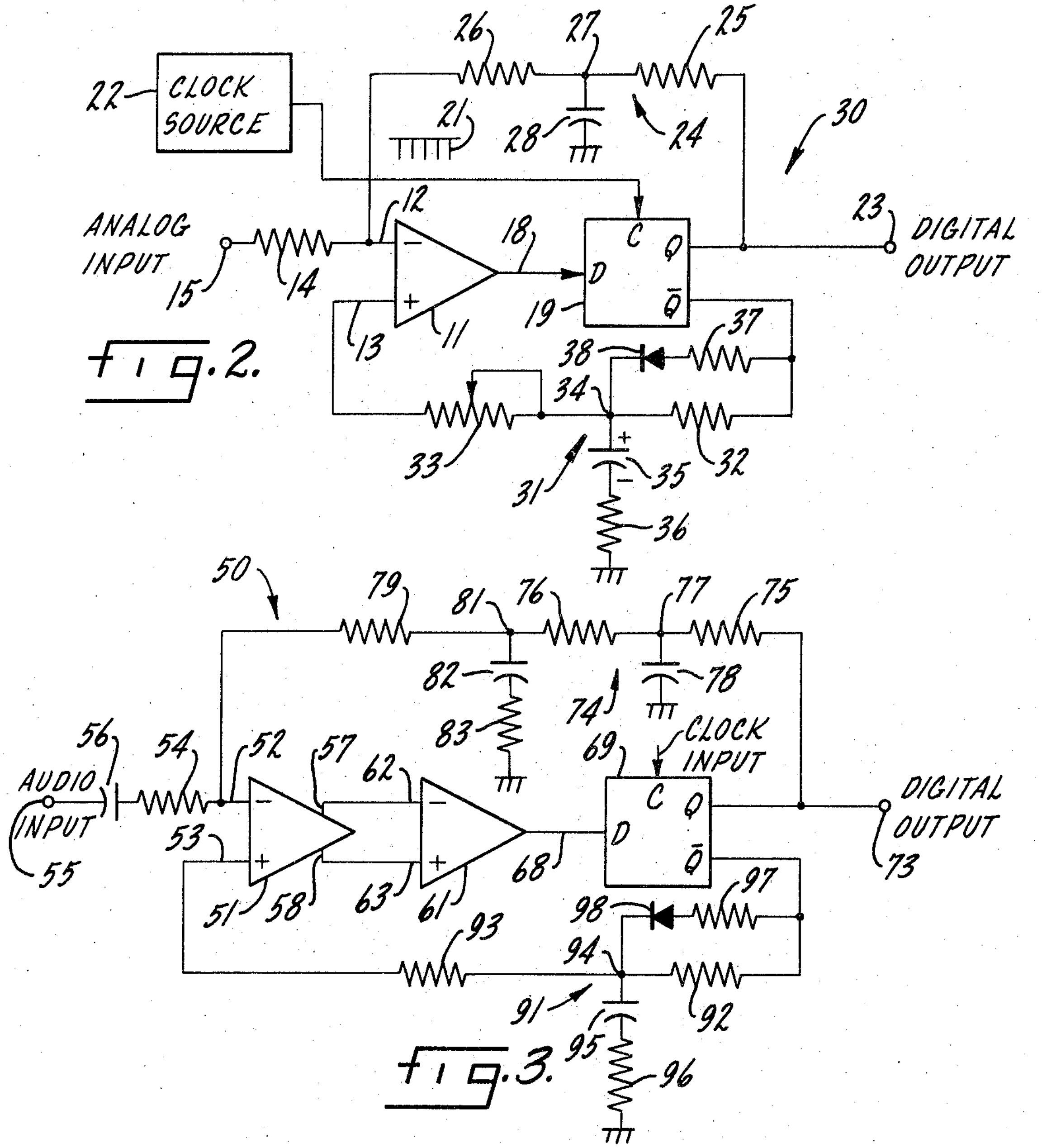
FIG. 2 is a circuit diagram of a simple delta modulator circuit constructed in accordance with the present invention.
FIG. 3 is a circuit diagram of a preferred form of delta modulator constructed in accordance with the present invention.

FIG. 2 illustrates a delta modulator 30, constructed in accordance with the present invention, in which the reference circuit of the modulator is modified to afford a uniformly low noise content in the output signal, under both no-signal (idling) and signal conditions, and that also is characterized by a smooth transition from no-signal to signal conditions. Modulator 30 comprises a high gain comparator amplifier 11 having its inverting input 12 connected to the terminal 15 through an input resistor 14. The output 18 of comparator amplifier 11 is connected to the D input of a sampling gate, which again comprises a conventional clock-controlled flip-flop 19. A clock signal 21 is applied to the clock input C of gate 19 from the clock source 22.

Like delta modulator 10 (FIG. 1), delta modulator 30 includes a principal integrating negative feedback circuit 24, having a short time constant, which is connected from the Q output of the sampling gate 19 back to the inverting input 12 of comparator amplifier 11. Feedback circuit 24 comprises the two series-connected resistors 25 and 26 having their common terminal 27 returned to ground through the storage capacitor 28. The Q output of flip-flop 19 is also connected to the terminal 23 that constitutes the output terminal for delta modulator 30.

The reference circuit for delta modulator 30 comprises a self-bias feedback circuit 31, which is an integrating circuit having a much longer time constant than circuit 24. The self-bias feedback circuit 31 is connected from the $\overline{Q}$ output of flip-flop 19 back to the non-inverting input 13 of comparator amplifier 11. Circuit 31 includes a resistor 32 connected in series with a potentiometer 33. The common terminal 34 of resistor 32 and potentiometer 33 is connected to a storage capacitor 35 which is returned to system ground through a very small resistor 36. A resistor 37 is connected in parallel with resistor 32. A non-linear impedance device is connected in series with resistor 37; in the illustrated circuit device 38 comprises a diode. Other uni-directionally conductive devices could also be employed.

In discussing the operation of delta modulator 30, FIG. 2, it is most convenient initially to consider the circuit as if resistor 37 and diode 38 were not present. On this basis, it is seen that the self-bias feedback circuit 31, which is an integrator with a long time constant, develops a reference signal that is essentially a D.C. voltage with limited variations resulting from changes in the long-term average level of the digital output signal appearing at the $\overline{Q}$ terminal of flip-flop 19. Any offset voltages developed in comparator amplifier 11 or in sampling gate 19 are effectively averaged out by circuit 31 and hence are minimized or eliminated with respect to their effect upon the digital output signal of the modulator as developed at terminal 23. With this self-bias circuit, modulator 30 can be constructed to afford a perfect balance between the reference voltage supplied to comparator terminal 13 and the average idling voltage reflected by the charge on capacitor 28, as discussed above. Once balance is achieved, a minor imbalance can be readily introduced by adjustment of potentiometer 33 to afford a minimal noise content in the output signal of the modulator and to eliminate the harsh noise effects that would be produced by the modulator if operated in a perfect balanced condition.

As noted above, resistor 36 has a very small impedance. This resistance is chosen to be just large enough so that, in conjunction with resistor 32, a small A.C. negative feedback signal is supplied to comparator terminal 13 through the feedback loop afforded by circuit 31. To achieve the requisite differential in time constants, capacitor 35 is much larger than capacitor 28. As a consequence, and due to the presence of resistor 36, delta modulator 30 achieves a much more random idling pattern, over a greater range of imbalance, than can be achieved with a fixed reference as employed in a conventional circuit. Thus, resistor 36 makes it possible to achieve effective and acceptable operation for audio signal processing without requiring undue precision in the degree of variation of the circuit from an exact balanced condition.

Resistor 37 and diode 38 introduce an additional factor into the operation of delta modulator 30. With this addition to the circuit, it is seen that the impedance of the reference feedback circuit 31 is somewhat lower for positive-going pulses than for negative-going pulses. Thus, the charge and discharge characteristics for capacitor 35 are asymmetrical. This non-linear characteristic introduces a further random factor into operation of the delta modulator that precludes establishment of a fixed idling pattern. The resulting combination of operation on the basis of a self-bias voltage derived from the $\overline{Q}$ output of sampling gate 19 for self-balancing of the modulator, coupled with a small non-linear negative A.C. feedback in the bias loop, provides for a reliable low noise idling operation with a smooth transition from no-signal to signal conditions. Furthermore, the noise content of the output signal appearing at terminal 23 can be maintained at a low level throughout a wide frequency range and over a broad range of input voltages.

FIG. 3 illustrates a preferred embodiment of the invention, comprising a delta modulator 50, employing the principles illustrated in FIG. 2 in a somewhat more sophisticated circuit having an improved dynamic range. Delta modulator 50 comprises a high gain amplifier 51 having an inverting input 52 and a non-inverting input 53. The input circuit to the delta modulator comprises a resistor 54 connected in series with a coupling capacitor 56 between the inverting input 52 of amplifier 51 and an input terminal 55.

Amplifier 51 has a first output 57 that is connected to the inverting input 62 of a comparator 61. Amplifier 51 has a second output 58 that is connected to the non-inverting input 63 of comparator 61. The output 68 of comparator 61 is connected to the D input of a sampling gate 69, again a conventional flip-flop device. The C input of flip-flop 69 is connected to a suitable clock source.

The Q ouptut of the sampling gate 69 is connected to a principal negative feedback loop 74, which is a two-stage integrating circuit having relatively short time constants. Feedback circuit 74 includes, in its first stage, two resistors 75 and 76 connected in series at a common terminal 77. Terminal 77 is connected to a capacitor 78 that is returned to system ground. The second integrating stage of circuit 74 includes the resistor 76, which is connected to a resistor 79 that is returned to the inverting input of amplifier 51. The common terminal 81 of resistors 76 and 79 is connected to a capacitor 82 that is returned to ground through a small resistor 83. As in the previous circuits, the output terminal 73 of the delta modulator is connected to the Q output of gate 69; in any of the modulators, the output could be derived from the $\overline{Q}$ output of the sampling gate if a polarity inversion were desired.

Modulator 50 further comprises a self-bias feedback loop 91 comprising an integrating circuit having a relatively long time constant. Feedback circuit 91 includes a resistor 92 connected in series with a resistor 93 from the $\overline{Q}$ output of flip-flop 69 to the non-inverting input 53 of amplifier 51. The common terminal 94 of resistors 92 and 93 is connected to a capacitor 95 that is returned to system ground through a very small resistor 96. A resistor 97 is connected in parallel with resistor 92 and a diode 98 is connected in series with resistor 97.

The operation of delta modulator 50 is basically the same as for modulator 30, as described above. In modulator 50, the comparator amplifier means comprises both the high gain amplifier 51 and the comparator circuit 61. The two circuits are employed in order to achieve a higher total gain. The dual integration circuit 74 employed as the primary feedback loop affords a wider dynamic range than in the simpler circuit of FIG. 2.

In order to afford a more complete illustration of the invention, specific circuit values and other parameters are set forth in the following table. It is to be understood that this information is presented solely by way of illustration and in no sense as a limitation of the invention.

RESISTORS

| | | |
|---|---|---|
| 54 | 22 | kilohms |
| 75, 76 | 1.0 | kilohms |
| 79, 93 | 8.2 | kilohms |
| 83 | 100 | ohms |
| 92 | 3.3 | kilohms |
| 96 | 1.0 | ohms |
| 97 | 10 | kilohms |

CAPACITORS

| | | |
|---|---|---|
| 56 | 0.47 | microfarad |
| 78 | 0.15 | microfarad |
| 82 | 0.015 | microfarad |
| 95 | 100 | microfarad |

SEMICONDUCTOR DEVICES

| | |
|---|---|
| Amplifier 51 | CA 3001 |
| Comparator 61 | ua 710 |
| Flip-flop 69 | SN 7474 |
| Diode 98 | In 4148 |

OTHER PARAMETERS

| | |
|---|---|
| Clock frequency | Hz |
| Audio input range | Hz to KHz |
| Dynamic input range | 0 to 10 volts |

The delta modulators of the invention, as described above in conjunction with FIGS. 2 and 3, are highly suitable for precision applications, including audio signal processing. The modulators of the invention are operable over a wide dynamic range and over a broad frequency range, introducing only a minimal noise content of relatively uniform nature into the digital signals that constitutes the outputs of the modulators. Quite substantial changes due to aging of components or variations in temperature and other environmental conditions can be tolerated without degradation of performance. Nevertheless, the modulators of the invention are simple and inexpensive in construction.

We claim:

1. A delta modulator, suitable for audio signal processing, which provides a subjectively tolerable low-level random idling noise in the demodulated output of the modulator, comprising:

high-gain comparator amplifier means having two inputs and an output;

input means for applying an initial analog signal to one input of the comparator amplifier means;

a sampling gate comprising a flip-flop circuit having a main input, a sampling input, and first and second outputs, one of the gate outputs comprising the modulator output, the main input of the sampling gate being connected to the output of the comparator amplifier means;

clock means for applying a high-frequency clock signal to the sampling input of the gate to control actuation of the gate between two alternate operating conditions and generate two output pulse signals of inverse polarity at the gate outputs;

a principal integrating negative feedback circuit, having a short time constant, connected from one output of the sampling gate to one input of the comparator amplifier means, for integrating one pulse signal from the gate to develop a replica analog signal and for applying that replica signal to the comparator amplifier means in bucking relation to the initial analog signal;

and a self-bias feedback circuit, comprising an integrating circuit having a long time constant, connected from one output of the sampling gate to one input of the comparator amplifier means, for applying a self-bias reference to the comparator amplifier means, the self-bias feedback circuit also transmitting a negative feedback A.C. signal of limited amplitude to introduce a limited broad-band noise content into the output signal of the modulator;

one of the feedback circuits being connected to the other input of the comparator amplifier means.

2. A delta modulator, according to claim 1, in which the self-bias feedback circuit includes a non-linear impedance affording a random idling characteristic in operation of the modulator.

3. A delta modulator, according to claim 2, in which the principal feedback circuit is connected back to the input of the comparator amplifier means and the self-bias feedback circuit is connected back to the other input of the comparator amplifier means.

4. A delta modulator, according to claim 2, in which the self bias feedback circuit includes two linear impedances connected in parallel and in which the non-linear impedance comprises a unidirectionally conductive device connected in series with one of the linear impedances.

5. A delta modulator, according to claim 4, in which the unidirectionally conductive device is a diode and the linear impedances are resistances.

6. A delta modulator, according to claim 1, in which the self bias feedback circuit comprises a series resistance and a shunt capacitance, and a very small resistance, as compared with the series resistance, connected in series with the shunt capacitance.

* * * * *